United States Patent [19]

Krishnakumar et al.

[11] Patent Number: 5,038,307
[45] Date of Patent: Aug. 6, 1991

[54] MEASUREMENT OF PERFORMANCE OF AN EXTENDED FINITE STATE MACHINE

[75] Inventors: Anjur S. Krishnakumar, Somerville; Mostafa H. Sherif, Tinton Falls, both of N.J.

[73] Assignee: AT&T Bell Laboratories, Murray Hill, N.J.

[21] Appl. No.: 428,573

[22] Filed: Oct. 30, 1989

[51] Int. Cl.⁵ ............................................. G06G 7/48
[52] U.S. Cl. .................................. 364/578; 364/900; 371/23
[58] Field of Search .................. 364/551.01, 578, 200, 364/900, 569; 371/19, 23, 27; 377/20

[56] References Cited

U.S. PATENT DOCUMENTS

| | | | |
|---|---|---|---|
| 4,587,625 | 5/1986 | Marino, Jr. et al. | 364/578 |
| 4,924,429 | 5/1990 | Kurashita et al. | 364/578 |
| 4,924,430 | 5/1990 | Zasio et al. | 371/23 |
| 4,933,883 | 6/1990 | Pennebaker et al. | 364/900 |
| 4,937,763 | 6/1990 | Mott | 364/551.01 X |
| 4,937,770 | 6/1990 | Samuels et al. | 371/23 X |
| 4,945,508 | 7/1990 | Bénéjean | 364/578 X |
| 4,965,758 | 10/1990 | Sherman | 371/23 X |

OTHER PUBLICATIONS

K. S. Sabnani et al., "PAV-Protocol Analyzer and Verifier" pp. 29-34 (1987).

Primary Examiner—Joseph L. Dixon
Attorney, Agent, or Firm—Thomas Stafford

[57] ABSTRACT

A method and apparatus is disclosed for determining an objective measure of performance of an extended finite state machine. Many modern complex systems, for example, computer communications protocols and computer or machine user interfaces, can be represented as extended finite state machines. A formal description of the extended finite state machine is employed to obtain a canonical form description. The canonical form description, combined with a service description, is used to generate a list of canocial state transitions transited by the extended finite state machine to perform the service. From this list, an objective measurement of performance, e.g., the time required to perform a particular service, is obtained. This objective measurement may then be used as desired, for example, to select an optimum extended finite state machine from a plurality of extended finite state machines.

20 Claims, 4 Drawing Sheets

MEASUREMENT OF PERFORMANCE OF AN EXTENDED FINITE STATE MACHINE

TECHNICAL FIELD

This invention relates to extended finite state machines and, more particularly, to obtaining a measure of their performance.

BACKGROUND OF THE INVENTION

Many modern complex systems can be represented as extended finite state machines. Computer communications protocols, computer or machine user interfaces and microprocessors are some commonly found examples of systems represented as extended finite state machines. Prior techniques for measuring extended finite state machine performance, e.g., the time it takes the machine to perform a particular service or task, have used either approximate mathematical models as the basis for performing simulations of the extended finite state machine or actual implementations of the extended finite state machine and after the fact measurements of performance. Problems with the first technique are that the results are only approximations and there are difficulties interpreting them. When comparing the performance of two different extended finite state machines that provide the same service it has been found that there generally is difficulty in normalizing the models of each machine to obtain a fair comparison. A problem with using an actual implementation is the expense in terms of time and money required before any results can be obtained. If a comparison is desired to choose the best from among several contending extended finite state machines, the cost increases since an actual implementation of each of the several extended finite state machines is required. An additional drawback with using actual implementations is that any change made to the extended finite state machines requires redoing the implementations. Another problem with using actual implementations is that the measurements that are made for use in a comparison are dependent on the details of each specific implementation, which may not yield an equitable comparison.

SUMMARY OF THE INVENTION

The prior difficulties with measuring extended finite state machine performance are overcome, in accordance with an aspect of the invention, by compiling processes of a formal description of the extended finite state machine into compiled processes having a format in which the state transitions are in canonical form. An important property of state transitions in canonical form is that any state transition represents a single unit of relative time. The canonical form processes are advantageously employed to determine the time required by the extended finite state machine to perform various services. More specifically, an objective measure of the time required to perform a particular service is obtained by determining the number of state transitions in canonical form required by the extended finite state machine to perform the service. In an exemplary embodiment, an Augmented Protocol Specification Language (APSL) description of an extended finite state machine is used to generate a canonical description of the extended finite state machine so that the number of canonical state transitions are easily determined.

DETAILED DESCRIPTION

The services provided by many modern complex systems can be modeled as one or more communicating extended finite state machines. Computer communications protocols and machine-user interfaces are some commonly found examples of systems that can be modeled as extended finite state machines. An extended finite state machine consists of a set of inputs, a set of outputs, a set of states, a next-state function which gives the new state of the extended finite state machine for a given input and a given present state and the present value of associated internal variables known as the context variables, and an output function which given an input and the present state and the present value of the context variables provides the output from the extended finite state machine and a set of actions which include updating the context variables. Each extended finite state machine in a group of communicating extended finite state machines is called a process. Some of the most common ways to describe extended finite state machines are natural language descriptions, flow charts, state (bubble) diagrams and formal descriptions (specifications). A formal description of an extended finite state machine is a description that is semantically precise.

In an embodiment of the invention, a formal description of the extended finite state machine in canonical form is advantageously employed, in accordance with an aspect of the invention, to obtain the desired objective measurement of performance for a particular service. For brevity and clarity of description, two relatively simple extended finite state machines are employed as examples in describing the operation of the invention. One of the extended finite state machines is then selected, in accordance with another aspect of the invention, as the optimum extended finite state machine for providing a particular service.

A first example of an extended finite state machine is a counter (COUNTER1) and its associated controller (CTRL1). COUNTER1 is a two digit (d0 and d1) decimal counter which, in this example, counts from 00 to 99 and, then, returns to zero (00). Controller CTRL1 supplies supervisory messages for controlling COUNTER1. COUNTER1 increments the count in response to a COUNT message from CTRL1. In turn, CTRL1 is responsive to a READY message from COUNTER1 to supply a next COUNT message. Upon reaching a count of 99 COUNTER1 returns to zero (00) and supplies a RESET message to CTRL1. COUNTER1 is then READY to receive additional COUNT messages from CTRL1.

Figure 1:
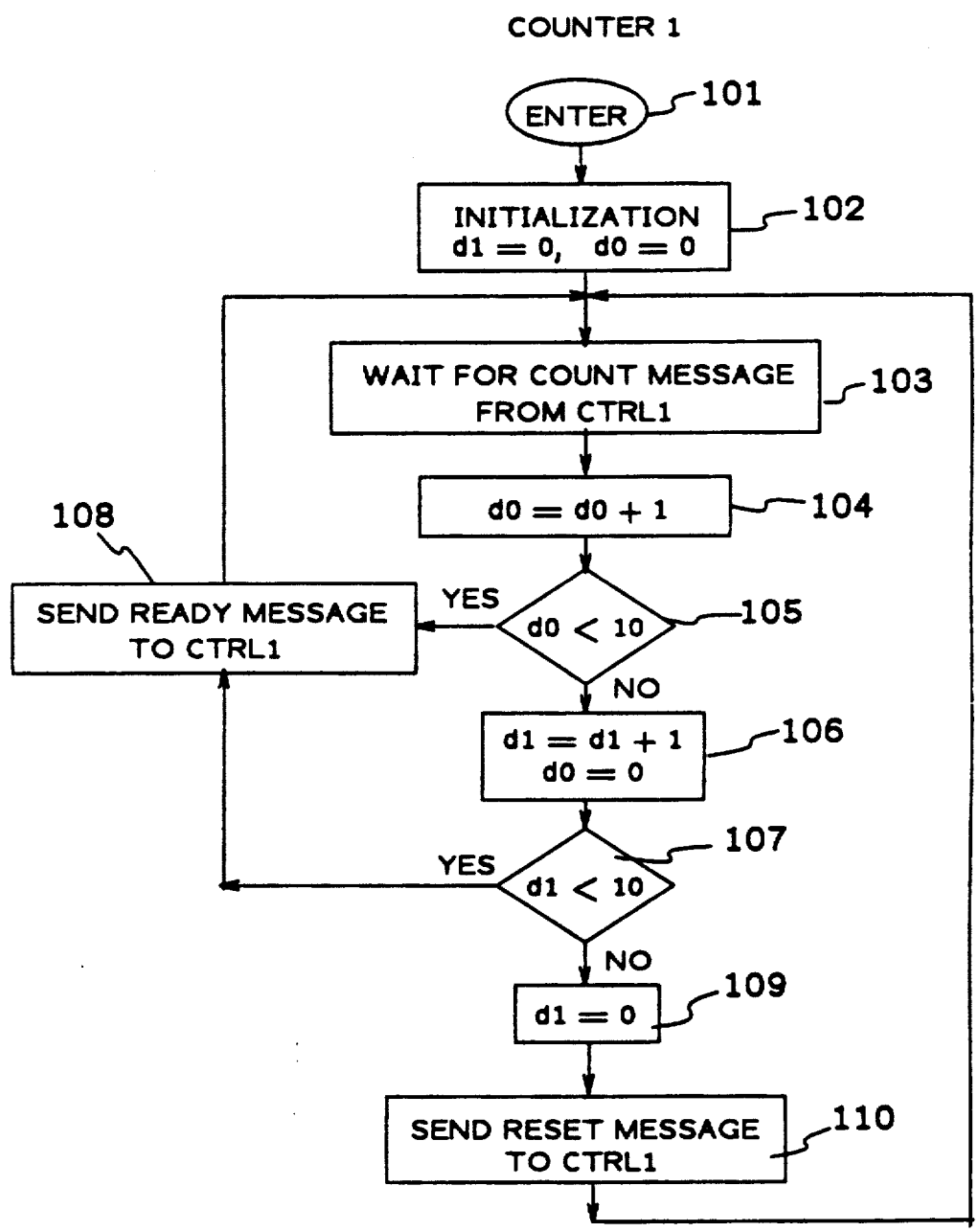
FIG. 1 is a non-formal description, in flow chart form, of the operation of COUNTER1.

Shown in FIG. 1 is a non-formal description of a sequence of steps illustrating the operation of COUNTER1 in flow chart form. The counting sequence of COUNTER1 is entered via step 101. Thereafter, step 102 initializes the counter, i.e., sets digits d0 and d1 to zero (0). Step 103 is then entered and COUNTER1 waits for a COUNT message from controller CTRL1 (not shown). Upon receipt of a COUNT message from controller CTRL1, step 104 is entered which increments digit d0 by one (1). conditional branch point 105 tests to determine if digit d0 is less than 10. (Even though d0 is a single digit, appearing externally only to count from zero (0) to nine (9), internally its representation allows it to assume values greater than nine (9) which are never seen externally.) If the test result in step 105 is YES, control is supplied to step 108 which sends a READY message to controller CTRL1. Control is then passed back to step 103 to wait for a COUNT message. If the test result in step 105 is NO, control is passed to step 106 in which digit d0 is set to zero (0) and digit d1 is incremented by one (1). Thereafter, conditional branch point 107 tests to determine if digit d1 is less than 10. If the test result in step 107 is YES, control is supplied to step 108 which sends a READY message to controller CTRL1. Control is then passed back to step 103 to wait for a COUNT message. If the test result in step 107 is NO, control is passed to step 109 which sets d1 to zero (0). Thereafter, step 110 sends a RESET message to controller CTRL1 and control is passed back to step 103 to wait for another COUNT message.

Once a non-formal description of operation of the extended finite state machine, i.e., COUNTER1 and controller CTRL1, is understood, a formal description can easily be derived. For purposes of example, TABLE 1 is a formal description of COUNTER1 and TABLE 2 is a formal description of controller CTRL1.

TABLE 1

PROCESS counter;
STATES 0,1,2;
REND controller?count,controller!reset,controller!ready;
INITIAL STATE 0;
TRANSITIONS
0:1 WHEN controller?count[d0+ +;],
1:0 WHEN {d0 < 10} controller!ready,
1:2 WHEN {d0 > = 10} [d1+ +;d0 = 0;],
2:0 WHEN {d1 < 9} controller!ready,
2:0 WHEN {d1 > = 9} controller!reset [d1=0;].

TABLE 2

PROCESS controller;
STATES 0,1;
REND counter!count,counter?ready,counter?reset;
INITIAL STATE 0;
TRANSITIONS
0:1 WHEN counter!count,
1:0 WHEN counter?ready,
1:0 WHEN counter?reset.

The formal descriptions of COUNTER1 and CTRL1 is shown in TABLE 1 and TABLE 2 are written, for convenience, in the Augmented Protocol Specification Language (APSL) which is a language for developing formal descriptions of extended finite state machines. Alternatively, other languages for formal description, such as ESTELLE or LOTOS, could have been chosen. It is noted, however, that all APSL messages are synchronous.

As shown in TABLES 1 and 2 an APSL description begins with a PROCESS statement which identifies the process. Next, the STATES statement lists the various states of the process. As can be seen, COUNTER1 has three states, namely, 0, 1 and 2 and CTRL1 and 2 states, namely 0 and 1. The REND statement defines all the input and output messages associated with the processes. Messages are of the form a?m1 or b!m2, where a?m1 indicates the reception of message m1 from process a and b!m2 indicates the transmission of message m2 to process b. This is a common notation used for representing communicating sequential processes and will be readily understood by those skilled in the art. Thus, as shown in FIG. 1, COUNTER1 sends (to CTRL1) the RESET and READY messages while receiving COUNT messages. The INITIAL STATE statement specifies the initial state of the process. This initial state must be one of the states specified in the STATES statement. TRANSITION statements are of the general form i:j WHEN{condition}a?m1*b!m2[update-operation].

As a matter of notational convention, i is the present state and j is the next state. The contents of curly brackets {} is the condition. The condition includes tests involving conditional expressions containing context variables. The received messages symbolized by a?m1 correspond to the given input specified in the definition of extended finite state machines. The transmitted messages represented by b!m2 correspond to a part of the output mentioned in the definition of extended finite state machines. Further, the contents of the square brackets [] are update operations, which include updating the context variables. The x*y form of TRANSITION statements implies event x followed by event y.

Extended finite state machines specified in APSL are assumed to be deterministic. This requires that, in any given state, only one outgoing transition be enabled under the given conditions. The set of conditions on all the outgoing transitions from a state must be mutually exclusive and collectively exhaustive. Therefore, all transitions or none from a given state should have enabling conditions.

A description of a extended finite state machine in canonical form is one in which all the transition statements of the formal description are in canonical form. Each transition statement in canonical form comprises only simple conditions and has at most one update operation and at most one input/output pair operation, e.g., one received message and one transmitted message. A simple condition is a single test expression of equality or inequality with no (express or implied) logical conjunctions. The update operations for transitions in canonical form are restricted to increment, decrement, addition, subtraction and assignment, their modulo n counterparts and function calls. A function is a complicated update operation which includes several instructions and other types of outputs that are not messages. An important property of state transitions in canonical form is that any state transition represents a single unit of relative time.

Thus, TABLE 3 shows, a canonical form description of COUNTER1 which results after compiling the formal description shown in TABLE 1.

TABLE 3

PROCESS counter,
STATES 0-3;
REND controller?count,controller!reset,controller!ready;
INITIAL STATE 0;
TRANSITIONS TABLE 3-continued

```
0:1 WHEN controller?count [ d0 + +; ],
1:0 WHEN { d0 < 10 } controller!ready,
1:3 WHEN { d0 > = 10 } [ d1 + +; ],
2:0 WHEN { d1 < 9 } controller!ready,
2:0 WHEN { d1 > = 9 } controller!reset [ d1 = 0; ],
3:2 WHEN [ d0 = 0; ].
```

As can be seen in the canonical form description of COUNTER1, additional state 3 was added to the formal description by the compiler so that the update operation of the transition from state 1 to state 2 of TABLE 1, which was a compound update operation, is broken into two separate single update operations. Thus, the two new transitions are in canonical form whereas the original transition they replace was not.

Since CTRL1 is such a simple process, its description in TABLE 2 is already in the canonical form.

TABLE 4 shows a service description for COUNTER1 providing the service of counting to 10. It will be readily understood by those skilled in the art that other service descriptions, such as a tour of all states under minimum error condition or a tour of all states under maximum error conditions, may be appropriate, depending on the nature of the extended finite state machine whose performance is to be measured.

TABLE 4

| Sender | Receiver | Message |
|---|---|---|
| controller | counter | COUNT |
| controller | counter | COUNT |
| controller | counter | COUNT |
| controller | counter | COUNT |
| controller | counter | COUNT |
| controller | counter | COUNT |
| controller | counter | COUNT |
| controller | counter | COUNT |
| controller | counter | COUNT |
| controller | counter | COUNT |

Figure 2:
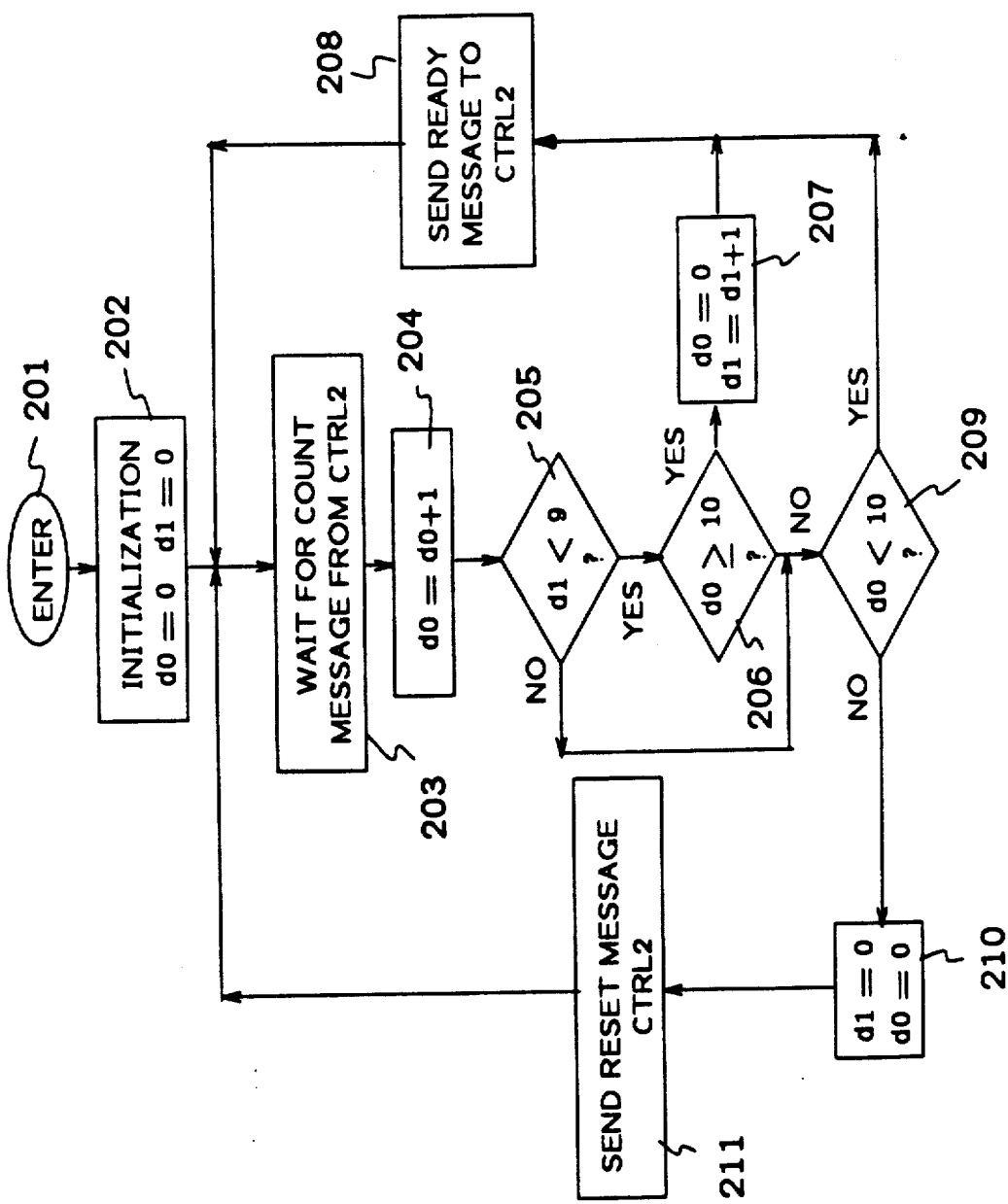
FIG. 2 is a non-formal description, in flow chart form of a sequence of operations effected by COUNTER2.

FIG. 2 is a non-formal description, in flow chart form of a sequence of operations effected by COUNTER2. COUNTER2 is associated with controller CTRL2 which is essentially identical to controller CTRL1 described above. Accordingly, the sequence is entered via step 201. Control is then passed to step 202 which initializes the counter and sets digits d0 and d1 to zero (0). Step 203 is then entered and the counter waits for a COUNT message from CTRL2. Upon receipt of a COUNT message step 204 is entered and digit d0 is incremented by one (1). Conditional branch point 205 tests to determine if digit d1 is less than nine (9). If the test result in step 205 is YES, control is supplied to step 206 which tests if d0 is greater than or equal to ten (10). If the test result in step 206 is YES, control is passed to step 207 which sets d0 to zero (0) and increments d1. Control is passed to step 208 which sends a READY message to controller CTRL2 before control is passed to step 203 to wait for another COUNT message. If the test results in either step 205 or step 206 is NO, control is passed to conditional branch point 209 which tests to determined if d0 is less than ten (10). If the test result in step 209 is YES, control is supplied to step 208 which sends a READY message to controller CTRL2. Thereafter, control is passed back to step 203 to wait for a COUNT message. If the test result in step 209 is NO, control is passed to step 210 which sets d0=0 and d1=0. Then, step 211 sends a RESET message to controller CTRL2 indicating that the counter was reset. Thereafter, control is passed to step 203 to wait for another COUNT message from controller CTRL2.

TABLE 5 shows, a formal description of COUNTER2 in APSL. COUNTER2 counts COUNT messages received from CTRL2 until 99 and upon receiving the 100th COUNT message automatically resets itself to zero (00).

TABLE 5

```
PROCESS counter;
STATES 0,1;
REND controller?count,controller!ready,controller!reset;
INITIAL STATE 0;
TRANSITIONS
0:1 WHEN controller?count [d0+ +;],
1:0 WHEN {d1 < 9 * d0 > = 10}
    controller!ready [d0=0;d1+ +;],
1:0 WHEN {d0 < 10} controller!ready,
1:0 WHEN {d1 = = 9 * d0 > = 10}
    controller!reset [d0=0;d1=0;].
```

TABLE 6 shows a canonical form description of COUNTER2 which results after compiling the formal description shown in TABLE 5. Four additional states denoted as states 2-5 were added by the compiler in order to simplify both the compound conditions of the transitions from state 1 to state 0 as well as the multiple update operation in a transitions from state 1 to state 0. The same service description that was used for COUNTER1 and shown in TABLE 4 is also used for COUNTER2.

TABLE 6

```
PROCESS counter;
STATES 0-5;
REND
controller?count,controller!ready,controller!reset;
INITIAL STATE 0;
TRANSITIONS
0:1 WHEN controller?count [ d0 + +; ],
1:2 WHEN { d1 < 9 },
1:0 WHEN { d0 < 10 } controller!ready;
1:3 WHEN { d1 = = 9 },
2:4 WHEN { d0 > = 10 } controller!ready [ d = 0; ],
2:1 WHEN { d0 < 10 },
3:5 WHEN { d0 > = 10 } controller!reset [ d0 = 0; ],
3:1 WHEN { d0 < 10 },
4:0 WHEN [ d1 + +; ].
5:0 WHEN [ d1 = 0; ].
```

Figure 3:
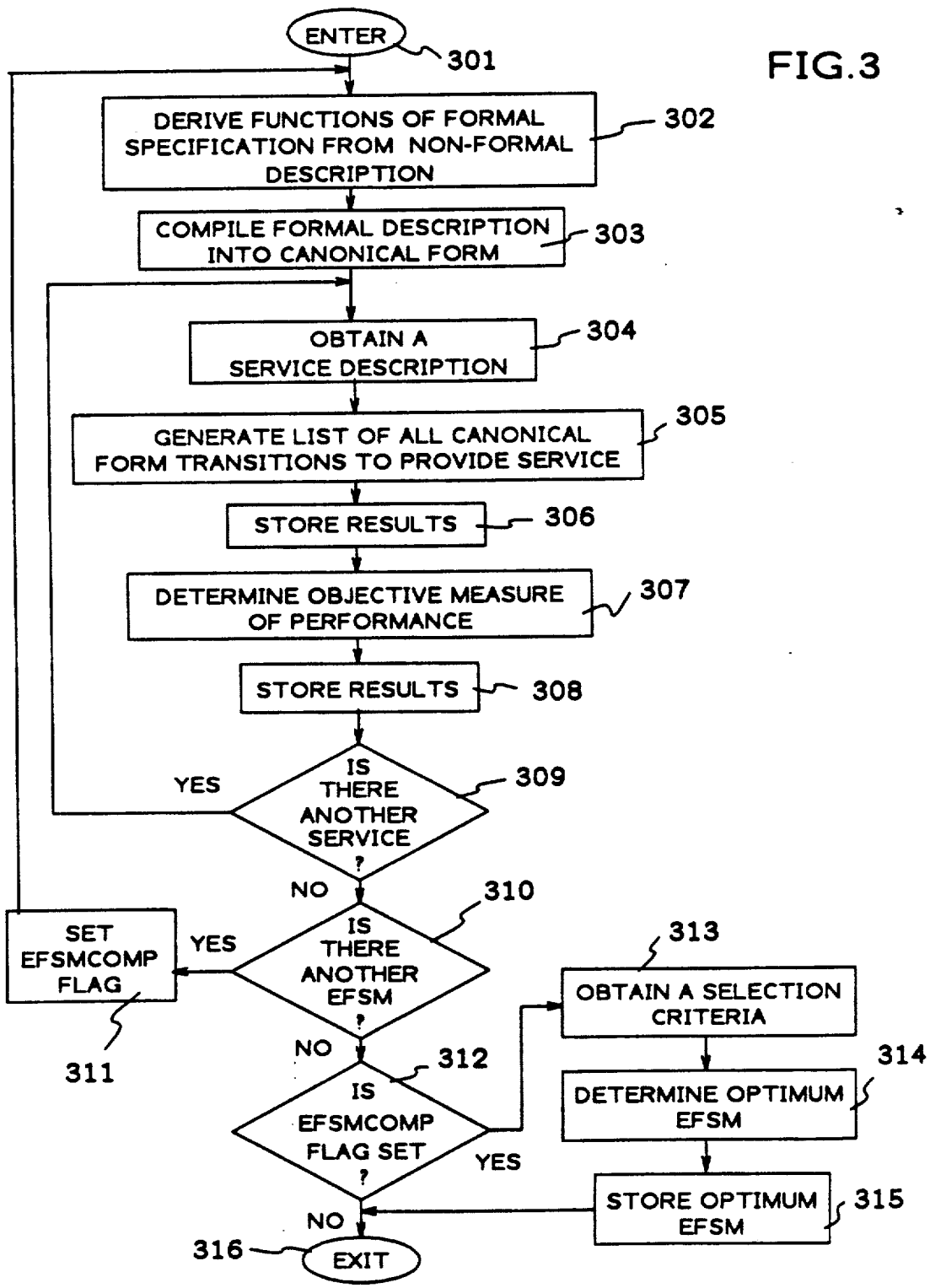
FIG. 3 depicts, in flow chart form, a sequence of steps for obtaining an objective measure of performance of an extended finite state machine, in accordance with aspects of the invention.

FIG. 3 depicts, in flow chart form, a sequence of steps for obtaining an objective measure of performance of an extended finite state machine, in accordance with aspects of the invention. As indicated above, in this example, two relatively simple extended finite state machines, namely COUNTER1 and COUNTER2, are employed in describing aspects of the invention.

Accordingly, the sequence is entered via step 301. Thereafter, a formal description of the processes of a first extended finite state machine, e.g. COUNTER1 and CTRL1, is derived in step 302 from an available non-formal description. Such an informal description is shown for COUNTER1 and CTRL1 in TABLE 1 and TABLE 2, respectively, above. Methods for deriving such formal descriptions are well known in the art. Showing the derivation of the formal description as a step in the process is for clarity and it will be apparent that such a description may already be available or may be prepared prior to initiating the objective measurement process. Next, in step 303, the formal description of the extended finite state machine is compiled into a canonical form description. A canonical description for COUNTER1 and CTRL1 is shown in TABLE 3 and TABLE 2, respectively, above.

Figure 4:
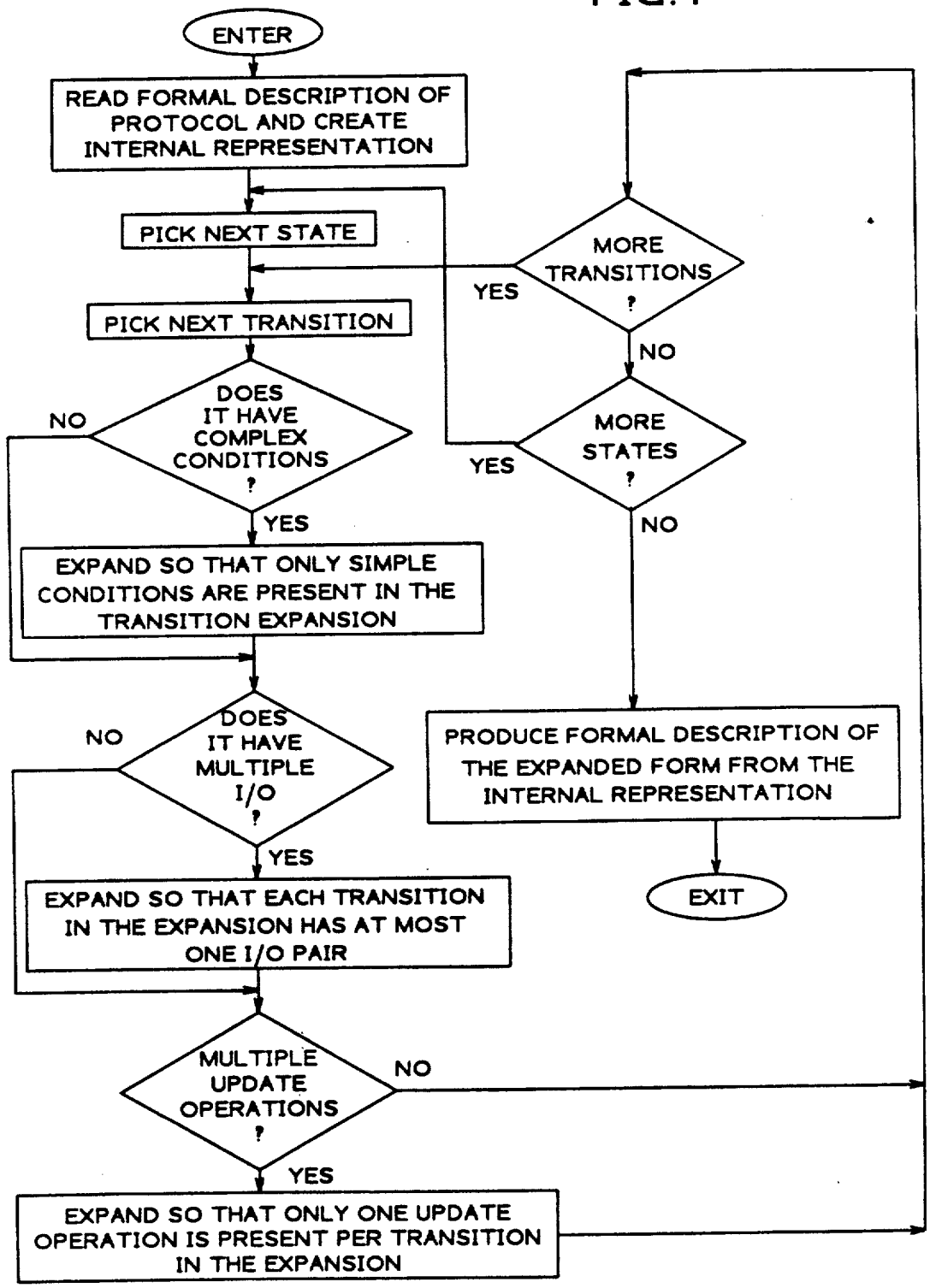
FIG. 4 shows, in simplified flow chart form, the basic operation of a simple compiler which compiles formal descriptions into canonical form.

FIG. 4 shows, in simplified flow chart form, the basic operation of a simple compiler which compiles the processes of a formal description into processes in canonical form. As shown, all complex conditions must be cast as a series of simplified conditions, multiple input/output (I/O) operations in a transition statement must be cast into multiple transitions with only a single I/O operation each and transitions with multiple update operations must be cast into multiple transitions with only a single update operation. Additional states are added as necessary to perform the necessary casting. Creating a specific implementation would be obvious to one skilled in the art of compiler design.

It is noted that the nature of the compiler employed can impact upon the objective performance measurement. Thus, with a simple compiler, the rules specifying how the compiler translates the multiple conditions and compound update operations into multiple transitions with simple conditions and only one update operation can affect the performance measurement. This effect occurs because the order of new transition statements created by a simple compiler may not be optimum for any given extended finite state machine. However, the rules of the compiler will be applied in the same manner to each extended finite state machine evaluated. Also, the performance measurement will be absolutely accurate if the compiled output is used to actually realize an implementation, for example, an integrated circuit based extended finite state machine. To overcome dependencies of the performance measurement on the rules inherent in simple compilers, an optimizing compiler could be used. By an optimizing compiler it is means one that can analyze the structure of the extended finite state machine and derive a compiled output such that the number of transitions executed to perform any service description is minimized. The nature and methods of producing optimizing compilers are well known. Alternatively, a flexible non-optimizing compiler could produce multiple compiled versions, each with a different order for the new transitions. Each compiled version of the formal description would be evaluated with respect to the service description and the performance criteria, as explained further below, to select an optimum compiled version. The performance measurement of the selected compiled version would then be assigned to the original extended finite state machine.

In step 304, a service description is obtained which describes the service to be performed in terms of the formal description of the extended finite state machine being used. Such a description may already be available or may be prepared prior to obtaining the objective measure of performance. Thereafter, in step 305 a list is generated of all the canonical form transitions actually transited in providing the service of the service description provided in step 304. TABLE 7 shows the list of the state transitions statements in canonical form transited by COUNTER1 and CTRL1 in performing the service description given in TABLE 4, i.e., counting to 10. The table of transitions is stored in step 306.

TABLE 7

| controller: transition from 0 to 1. | } | |
| --- | --- | --- |
| Total number of transitions = 1 | } | |
| Total number of original transitions = 1 | } | |
| | } set of transitions | |

TABLE 7-continued

| counter: transition from 0 to 1. | } for 1 count |
| --- | --- |
| counter: transition from 1 to 0. | } |
| . | } |
| . | } |
| Total number of transitions = 2 | } |
| Total number of original transitions = 2 | } |
| controller: transition from 1 to 0. | |
| controller: transition from 0 to 1. | |
| Total number of transitions = 2 | |
| Total number of original transitions = 2 | |
| counter: transition from 0 to 1. | |
| counter: transition from 1 to 0. | |
| Total number of transitions = 2 | |
| Total number of original transitions = 2 | |
| controller: transition from 1 to 0. | |
| ... | |
| 6 more sets | |
| ... | |
| controller: transition from 0 to 1. | |
| Total number of transitions = 2 | |
| Total number of original transitions = 2 | |
| counter: transition from 0 to 1. | |
| counter: transition from 1 to 0. | |
| Total number of transitions = 2 | |
| Total number of original transitions = 2 | |
| controller: transition from 1 to 0. | |
| controller: transition from 0 to 1. | } |
| Total number of transitions = 2 | } |
| Total number of original transitions = 2 | } Set of transitions |
| counter: transition from 0 to 1. | } for the |
| counter: transition from 1 to 3. | } roll over |
| counter: transition from 3 to 2. | } |
| counter: transition from 2 to 0. | } |
| Total number of transitions = 4 | } |
| Total number of original transitions = 3 | } |
| | } |
| controller: transition from 1 to 0. | |

Next, step 307 obtains a measure of performance of the extended finite state machine, in accordance with an aspect of the invention, by determining how many canonical transitions are listed in the list produced in step 305. This result is stored in step 308. It is determined, in accordance with an aspect of the invention, that for the extended finite state machine consisting of COUNTER1 and CTRL1 that the number of state transitions in canonical form, which is its objective measure of performance, is 42. There are 20 transitions transited by CTRL1 and 22 by COUNTER1.

It may be advantageous to evaluate the performance of further services provided by this extended finite state machine. Accordingly, conditional branch point 309 tests if an objective measure of performance of another service is desired. If the test result in step 309 is YES, control is passed to step 304 to obtain another service description. If the result of the test in step 309 is NO, no further services are to be evaluated for COUNTER1 and CTRL1. Therefore, control is passed to conditional branch point 310 which tests if another extended finite state machine (EFSM) is to be evaluated. If the test result in step 310 is YES, control is passed to step 311 to set the EFSMCOMP flag. Setting the EFSMCOMP indicates that more than one extended finite state machine is being evaluated and that the performance measurement results for the extended finite state machines should be compared to select an optimum extended finite state machine. Thereafter, control is passed to step 302 and step 302 through 311 of the process are repeated until step 310 yields a NO result. Then, control is passed to conditional branch point 312.

In this example, a second extended finite state machine, e.g. COUNTER2 and CTRL2, is to be evaluated.

Therefore, the result of the test in step 310 is YES causing EFSMCOMP to be set and control passed to step 302.

Thereafter, Steps 302 through 309 are repeated for COUNTER2 and CTRL2 using the service description provided in TABLE 4. In our example, for sake of brevity and clarity a single service description was applicable to both extended finite state machines. It should be noted that due to differences in the extended finite state machines the service descriptions for the same service might not be identical. What is important is that the service actually provided, which is described by the service description, be substantially the same for each extended finite state machine so as to obtain a fair comparison.

TABLE 8 shows a list of the state transitions statements in canonical form transited by COUNTER2 and CTRL2 in performing the description given in TABLE 4. It is determined, in accordance with an aspect of the invention, that for COUNTER2 and CTRL2 the number of state transitions in canonical form and the objective measure of its performance is 60. There are 20 transitions transited by CTRL2 and 40 by COUNTER2.

TABLE 8

```
controller: transition from 0 to 1.        }
                                           }
Total number of transitions = 1            }
Total number of original transitions = 1   }
                                           } set of transitions
counter: transition from 0 to 1.           } for one count
counter: transition from 1 to 2.           }
counter: transition from 2 to 1.           }
counter: transition from 1 to 0.           }
                                           }
Total number of transitions = 4            }
Total number of original transitions = 2   }
                                           }
controller: transition from 1 to 0.        }
controller: transition from 0 to 1.
Total number of transitions = 2
Total number of original transitions = 2
counter: transition from 0 to 1.
counter: transition from 1 to 2.
counter: transition from 2 to 1.
counter: transition from 1 to 0.
Total number of transitions = 4
Total number of original transitions = 2
controller: transition from 1 to 0.
...
6 more sets
...
controller: transition from 0 to 1.
Total number of transitions = 2
Total number of original transitions = 2
counter: transition from 0 to 1.
counter: transition from 1 to 2.
counter: transition from 2 to 1.
counter: transition from 1 to 0.
Total number of transitions = 4
Total number of original transitions = 2
controller: transition from 1 to 0.       }
                                          }
controller: transition from 0 to 1.       }
                                          }
Total number of transitions = 2           }
Total number of original transitions = 2  }
                                          } set of transitions
counter: transition from 0 to 1.          } for the roll over
counter: transition from 1 to 2.          }
counter: transition from 2 to 4.          }
counter: transition from 4 to 0.          }
                                          }
Total number of transitions = 4           }
Total number of original transitions = 2  }
                                          }
```

TABLE 8-continued

```
controller: transition from 1 to 0.        }
```

Since there are no further extended finite state machines to evaluate, step 310 yields a NO result and control passes to conditional branch point 312. Conditional branch point 312 tests the state of the EFSMCOMP flag to determine whether more than one extended finite state machine has been evaluated. If the EFSMCOMP flag is not set, the sequence is exited by step 316. If the EFSMCOMP flag is set, more than one extended finited state machine has been evaluated and control is passed to step 313 to obtain a selection criteria. A sample criteria for choosing between COUNTER1 and COUNTER2 is the counter that requires the minimum time to perform a service. In our example, this criteria corresponds to the minimum number of transitions in canonical form for performing the service specified by the service description found in TABLE 4, i.e. counting to ten (10). As will be obvious to those skilled in the art, other criteria such as maximum time or the minimum number of service calls could have been chosen, if so desired.

Control is then passed to step 314 which determines which of the extended finite state machines is optimum under the given service descriptions and selection criteria. Clearly, the extended finite state machine consisting of COUNTER1 and CTRL1, requiring only 42 canonical form transitions is considered optimum when based on a selection criteria of minimum time to perform the service, i.e., the minimum number of transitions in canonical form, when compared with COUNTER2 and CTRL2 which requires 60 canonical form transitions. Thus COUNTER1 and CTRL1 are selected as optimum. This result is stored in step 315 and, finally, the routine is exited via step 316.

We claim:

1. Apparatus for obtaining a measure of performance of an extended finite state machine comprising:
   means for compiling processes of a formal specification which describes an extended finite state machine into compiled processes having a format in which state transitions of said compiled processes are in canonical form;
   means for storing said compiled processes;
   means for storing a service description;
   means responsive to both said stored compiled processes and said stored service description for generating a list of all canonical state transitions transited by said extended finite state machine in the performance of the service described in said service description; and
   means for utilizing said list of canonical form state transitions to obtain an objective measure of performance of said extended finite state machine.

2. The invention as defined in claim 1 wherein each of said canonical form state transitions represents a predetermined time interval.

3. The invention as defined in claim 1 wherein said service description describes a tour of all states of the extended finite state machine under minimum error conditions.

4. The invention as defined in claim 1 wherein said service description describes a tour of all states of the extended finite state machine under maximum error conditions.

5. The invention as defined in claim 1 wherein said means for compiling processes comprises optimization means for generating an optimum compiled process for each process of said formal specification.

6. The invention as defined in claim 1 wherein said means for utilizing includes means for determining the number of said state transitions in said list.

7. The invention as defined in claim 6 wherein said number of canonical form state transitions in said list is representative of a time interval required by said extended finite state machine to perform said service described in said service description.

8. Apparatus for automatically determining an optimum extended finite state machine from a plurality of extended finite state machines comprising:
means for compiling processes of a plurality of formal descriptions, each description of said plurality of formal descriptions describes a corresponding one of a plurality of extended finite state machines, into a plurality of compiled processes having a format in which state transitions of said plurality of compiled processes are in canonical form;
means for storing said plurality of compiled processes;
means for storing a plurality of sets of service descriptions, one set for each extended finite state machine, each of said plurality of sets corresponding to similar services under similar conditions for each of said plurality of extended finite state machines;
means responsive to both said plurality of stored compiled processes describing said plurality of extended finite state machines in canonical form and said plurality of sets of stored service descriptions for generating and storing a plurality of lists of canonical form state transitions transited by said plurality of extended finite state machines in the performance of said services described in said sets of service descriptions, a separate set of lists being generated for each of said plurality of extended finite state machines; and
means for utilizing said plurality of sets of lists of canonical form state transitions to obtain an objective measure of performance of each of said plurality of extended finite state machines for its corresponding set of service descriptions and for selecting an optimum extended finite state machine based upon said objective measures of performance.

9. The invention as defined in claim 8 wherein said means for utilizing and for selecting includes means for storing one or more selection criteria and means for comparing said plurality of sets of stored lists of canonical state transitions transited by corresponding ones of said plurality of extended finite state machines to perform their respective ones of said service descriptions and based on said stored selection criteria to automatically determine an optimum extended finite state machine from among said plurality of extended finite state machines.

10. The inventions as defined in claim 9 wherein each of said canonical state transitions represents a predetermined time interval and wherein said means for utilizing and for selecting further includes means for determining the number of said state transitions in each of said plurality of sets of lists, wherein said number of state transitions in each of said plurality of sets of lists is an objective measurement of performance of the corresponding extended finite state machine and is representative of a time interval for performing the corresponding service description.

11. A method for obtaining a measure of performance of an extended finite state machine comprising the steps of:
compiling processes of a formal description of an extended finite state machine into compiled processes having a format in which state transitions of said compiled processes are in canonical form;
storing a service description of a service for which a measure of performance of the extended finite state machine is to be obtained;
generating a list of all state transitions in canonical form transited by said extended finite state machine in the performance of said service described in said service description in response to both said compiled processes and said service description; and
utilizing said list of state transitions to obtain an objective measurement of performance of said extended finite state machine.

12. The method as defined in claim 11 wherein each of said canonical form state transitions represents a predetermined time interval.

13. The method as defined in claim 11 wherein said service description describes a tour of all states of the extended finite state machine under minimum error conditions.

14. The method as defined in claim 11 wherein said service description describes a tour of all states of the extended finite state machine under maximum error conditions.

15. The method as defined in claim 11 wherein said compilation results in the generating of an optimum compiled process for each process of said formal specification.

16. The method as defined in claim 11 wherein the step of utilizing includes a step of counting the number of state transitions in said list, wherein said number is a representation of said objective measure of performance.

17. The method as defined in claim 16 wherein the number of canonical form state transitions in said list is representative of a time interval required by said extended finite state machine to perform said service described in said service description.

18. A method for automatically determining an optimum extended finite state machine from a plurality of extended finite state machines comprising the steps of:
compiling processes of a plurality of formal descriptions, each description of said plurality of formal descriptions describes a corresponding one of a plurality of extended finite state machines, into a plurality of compiled processes having a format in which state transitions of said plurality of compiled processes are in canonical form;
storing a plurality of sets of service descriptions, one set for each extended finite state machine, each of said plurality of sets corresponding to similar services under similar conditions for each of said plurality of extended finite state machines;
generating and storing, in response to both said plurality of stored compiled processes describing said extended finite state machines in canonical form and said plurality of sets of stored service descriptions, a plurality of sets of lists of canonical form state transitions transited by said plurality of extended finite state machines in the performance of said services described in said sets of service descriptions, a separate set of lists being generated for each of said plurality of extended finite state machines;

utilizing said plurality of sets of lists of canonical form state transitions to obtain an objective measure of performance of each of said plurality of extended finite state machines for its corresponding set of service descriptions; and selecting an optimum extended finite state machine based upon said objective measures of performance.

19. The method as defined in claim 18 wherein said step of selecting includes the step of storing one or more selection criteria and comparing said plurality of sets of stored lists of canonical state transitions transited by corresponding ones of said plurality of extended finite state machines in the performance of their respective ones of said service descriptions and based on said stored selection criteria to automatically determine an optimum extended finite state machine from among said plurality of extended finite state machines.

20. The method as defined in claim 19 wherein each of said canonical state transitions represents a predetermined time interval and wherein said step for utilizing includes the step of determining the number of said state transitions in each of said plurality of sets of lists, wherein said number of state transitions in each of said plurality of sets of lists is an objective measurement of performance of the corresponding extended finite state machine and is representative of a time interval for performing the corresponding service description.

* * * * *